United States Patent [19]

Straemke

[11] Patent Number: 5,283,414
[45] Date of Patent: Feb. 1, 1994

[54] PLASMA TREATMENT APPARATUS

[76] Inventor: Siegfried Straemke, Fichtenhain 6, D-5135 Selfkant 4, Fed. Rep. of Germany

[21] Appl. No.: 665,697

[22] Filed: Mar. 7, 1991

[30] Foreign Application Priority Data

Mar. 7, 1990 [DE] Fed. Rep. of Germany ....... 4007123

[51] Int. Cl.⁵ ................................................ B23K 9/00
[52] U.S. Cl. .......................... 219/121.43; 219/121.54; 219/121.51; 204/298.36; 315/111.81
[58] Field of Search ...................... 219/121.43, 121.44, 219/121.59; 156/643, 646, 345; 204/298.36, 298.34, 298.37; 315/111.81

[56] References Cited

U.S. PATENT DOCUMENTS

| | | | |
|---|---|---|---|
| 4,430,547 | 2/1984 | Yoneda et al. | 156/643 |
| 4,624,214 | 11/1986 | Suzuki et al. | 118/719 |
| 4,816,638 | 3/1989 | Ukai et al. | 219/121.43 |
| 4,820,907 | 4/1989 | Terauchi et al. | 219/121.43 |
| 5,047,115 | 9/1991 | Charlet et al. | 156/345 |
| 5,082,542 | 1/1992 | Moslehi et al. | 156/643 |

*Primary Examiner*—Mark H. Paschall
*Attorney, Agent, or Firm*—Spensley, Horn, Jubas & Lubitz

[57] ABSTRACT

The plasma treatment apparatus includes a vacuum-tight first container for receiving the workpieces to be treated, and a pressure-tight second container enclosing the first container. The intermediate space between the two containers can be evacuated by a suction device. If a high-temperature process is performed within the inner container, the intermediate space is evacuated, whereby the inner container is relieved of pressure while the outer container, taking up the pressure, is maintained at a low temperature. With low operating temperatures, a gas is kept in convective flow within the intermediate space so that heat is transmitted from the inner container to the outer container. In this case, pressure is taken up by the inner container.

8 Claims, 1 Drawing Sheet

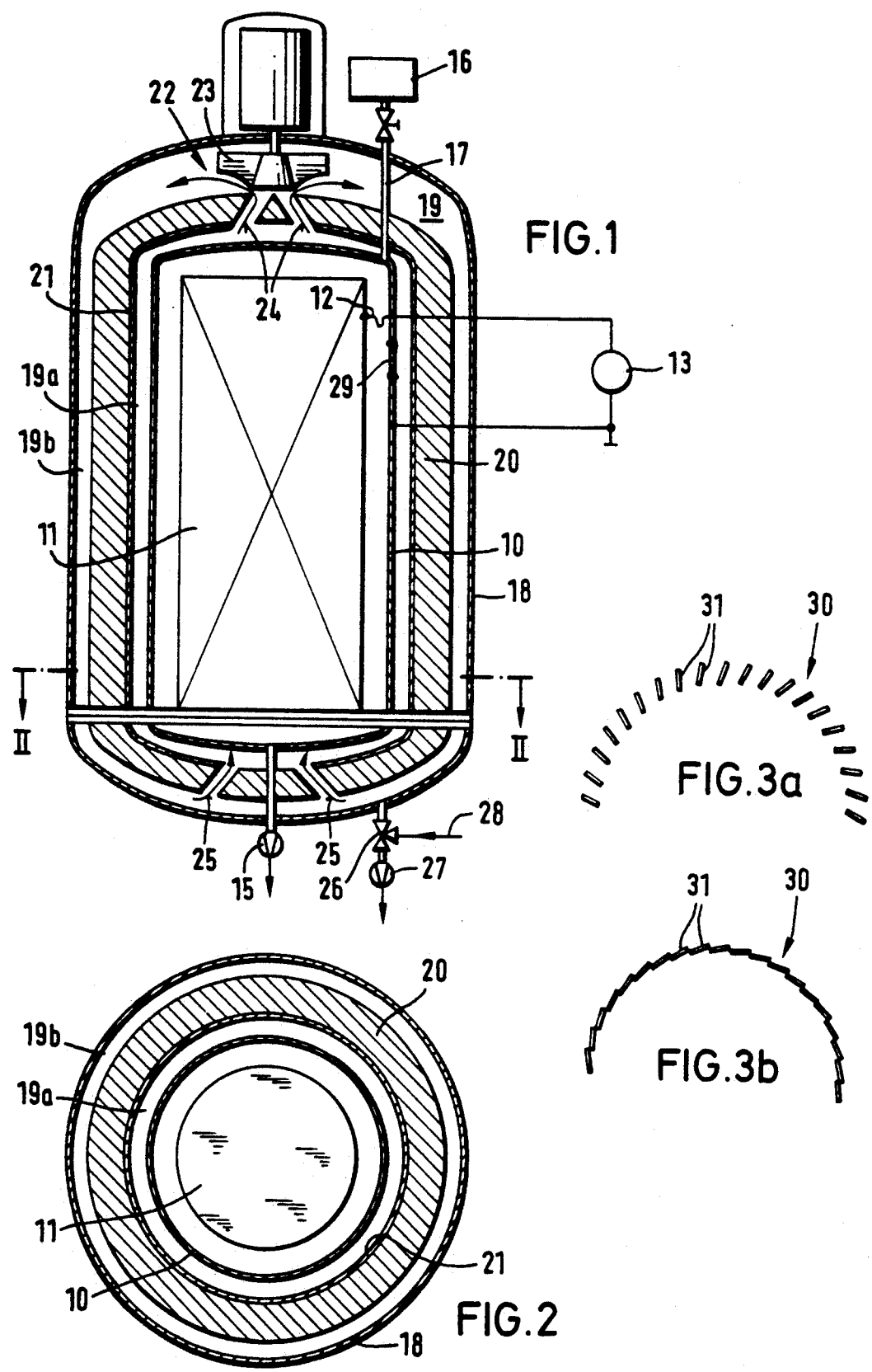

PLASMA TREATMENT APPARATUS

BACKGROUND OF THE INVENTION

1. Field of the Invention

The invention is directed to a plasma treatment apparatus.

2. Description of Related Art

Plasma treatment apparatuses are used in surface treatment of workpieces for inserting foreign atoms into the workpiece surface, e.g. for the purpose of curing, reduction of wear or coating. In plasma treatment of workpieces, a glow discharge in a vacuum is generated between the workpiece and a counterelectrode while a treatment gas is present in the container at a low pressure (in the range of a few millibars only). From the plasma generated in the treatment gas during glow discharge, gas atoms diffuse into the surface layer of the workpiece.

In thermochemical surface treatment, e.g. in plasma cuburizing, the energy fed to the workpiece by the surface treatment processes has to be kept at a certain level by heat-transmission mechanisms. This mans that a specific treatment temperature, which is determined by the type of the respective procedure, must be maintained. To this effect, it may be necessary to withdraw heat through the container wall.

In a plasma treatment apparatus known from U.S. Pat. No. 4,645,981, the workpiece is inserted into a vacuum-tight container, and clocked glow discharges are generated between the container wall and the workpiece. According to the respective process to be carried out, the energy densities can vary from just a few microwatts to several watts per square centimeter. The container is enclosed by a heat-insulating sheath, and a cooling agent, having been introduced into the intermediate space, is sucked off in downward direction by a sucking means.

Plasma treatment systems have been used heretofore only for one process or, respectively, only for one specific workpiece surface. For this purpose, the container has been provided with a water jacket for cooling, with a heat insulation means provided inside. If such a container, to be used e.g. for a specific workpiece surface, id designed for a temperature of up to 1000° C., the insulation of the container is much too high in case of an operating temperature of 500° C. If the workpiece surface is small, the container can be used neither at 500° C. nor at 1000° C. because the energy yielded by the plasma is not sufficient for heating the container, i.e. an additional heating means has to be installed. The simple solution of using a container of high-quality material (e.g. Inconel) and —if needed—cooling it from the outside is not possible at temperatures above 800° C. due to the lack of rigidity of the material. Another solution provides using a water-cooled outer container, mounting an insulating means of inferior quality and compensating the losses by an additional heating means. Although this solution is feasible, it is highly energy-consuming.

A plasma treatment apparatus known from British Patent No. 1 567 929 comprises a vacuum-tight outer container accommodating therein the inner container forming the negative electrode. An electric heating means is arranged in the intermediate space between the outer container and the inner container. The outer container can be provided with a water cooling means Also, a double-walled walled container of this type is always adapted only for a very restricted range of treatment temperatures.

British Patent No. 1 575 939 discloses a similar plasma treatment apparatus wherein, in a double-walled container, a heating means is arranged around the negative electrode and is surrounded by a radiation insulating means. The radiation insulation means consists a lamellae adjustable relative to each other.

It is an object of the invention to provide a plasma treatment apparatus which in case of high treatment temperatures, can be operated without a complicated cooling system and which, if required, can be used also for processes performed at low operating temperatures.

SUMMARY OF THE INVENTION

The plasma treatment device of the invention is provided with two containers arranged within each other, each of the containers being vacuum-tight. If a treatment process involving relatively high temperatures, e.g. within the range of 800° C.–1300° .C, is carried out in the treatment chamber, i.e. inside the first container, the intermediate space between the two containers is evacuated so that the vacuum is present not only within the inner container but also within the outer container. The vacuum in the intermediate space serves, on the one hand, to provide good thermal insulation between the treatment chamber and the environment of the treatment apparatus while, on the other hand, the inner container is kept free from considerable pressure loads and thus is resistant to the high temperatures in its unloaded condition. A further advantage consists in the good thermal encapsulation of the treatment chamber obtained by the vacuum insulation in the intermediate space so that only a little heat is lost and the whole process is carried out with relatively low energy demand.

If the plasma treatment apparatus is used for a process to be performed with relatively low treatment temperature, e.g. below 800° C., air or another gas can be introduced into the intermediate space. In this case, vacuum sealing is provided by the inner container. At low temperatures, the material of the container is resistant to the occurring pressure loads. In as far as a cooling means is needed for heat reduction, a convective flow can be guided along the wall of the inner container, which wall then transmits the heat to the wall of the outer container. In addition to this arrangement, or by way of an alternative, a radiation insulating means consisting of radiation-reflective lamellae can be provided in the intermediate space. In any case, the intensity of the cooling can be varied according to the process requirements by setting the speed of the convective flow or adjusting the lamellae. It is also possible that air from the environment may be blown through the apparatus, said air being guided along the inner container by means of valves and being discharged from the system through further valves.

Of course, the heat is preferably guided off the outer container by a suitable device as e.g. a cooling blower.

BRIEF DESCRIPTION OF THE DRAWINGS

An embodiment of the invention will be explained in greater detail hereunder with reference to the drawings.

In the drawings

FIG. 1 is a schematic vertical sectional view of the plasma treatment apparatus, FIG. 2 is a horizontal sectional view taken along the line II—II of FIG. 1, and FIGS. 3a and 3b are schematic representations of different states of a radiation insulating means consisting of lamellae.

DESCRIPTION OF THE PREFERRED EMBODIMENTS

The plasma treatment apparatus has a vacuum-tight inner container 10, consisting of heat-resistant metal and being entirely closed. The workpiece to be treated is inserted into this container 10. Container 10 can be provided e.g. with a plate for placing the workpiece thereon or a pending device for pending attachment of the workpiece. The conduit of an electrode 12 is guided through the wall of the completely encapsuled container 10. The counterelectrode is provided by the wall of container 10. This wall is connected to one pole of a power source 13, and the workpiece is connected through electrode 12 to the other pole of the power source.

The container 10 is connected to a vacuum pump 15 for sucking off the gas stored in the container. A conduit 17, originating at a gas source 16, leads into container 10 for supplying the container with dosed quantities of the treatment gas, e.g. hydrogen, nitrogen, methane or agon. The pressure of the treatment gas in container 10 is just a few millibars.

The above described apparatus is basically suited for plasma treatment of the workpiece. By the difference of potentials between the workpiece and the container wall, a glow discharge is generated around the workpiece so that the treatment gas changes over into the plasma state. At the same time, atoms of the treatment gas are diffused into the workpiece surface.

The container 10 is enclosed on all sides by the outer container 18 which is also vacuum-tight and fulfills the same physical requirements as the inner container 10. The intermediate space 19 extends between the two containers and encloses the container 10 from all sides. This means that no touch contact exists between the two containers.

The intermediate space 19 contains a thermal insulation means 20 forming an enclosure surrounding the inner container 10 from all sides. This enclosure is arranged at a distance both to the inner container 10 and to the outer container 18, thus providing a space 19a between insulation means 20 and inner container 10 and a space 19b between insulation means 20 and outer container 18. The inner side of insulation means 20 has attached thereto a radiation heating means 21 consisting e.g. of heating wires.

In addition to the thermal insulation means 20, a circulating means 22 is provided for convection insulation. This convection insulation means includes a blower 23 for sucking gas through channels 24 of insulation means 20 out of inner space 19a and conveying said gas into outer space 19b. At the end facing away from blower 23, further channels 25 are provided within insulation means 20. Through these channels 25, the gas is returned from the outer space 19b to the inner space 19a. Within inner space 19a, the gas streams along the wall of the inner container 10 for cooling this container wall. Then, the gas passes through said channels 24 into the outer space 19b where the heat contained in the gas is transmitted to the wall of the outer container 18. In this manner, heat transfer is performed from inner container 10 to outer container 18 by a convection effect.

Through a three-way valve 26, the intermediate space 19 can be connected either to a suction means 27 consisting of a vacuum pump or to an air inlet conduit 28.

If plasma treatment of the workpiece 11 is to be carried out at a low temperature, air or another gas is introduced into intermediate space 19 through said air inlet conduit 28 so that atmospheric conditions will prevail in the intermediate space. For cooling the inner container 10, the circulating means 22 is actuated which, in the described manner, transmits heat from inner container 10 to outer container 18 by convection. In this operating mode, the outer container 18 acts only as a heat-exchange means with the environment. In this case, container 18 has no pressure-resistant function.

If processes are performed in the treatment chamber at high temperatures, intermediate space 19 is evacuated by suction means 27 via valve 26. In the treatment chamber and in the intermediate space 19, the pressure will then be substantially identical, so that the outer container 18 fulfills the pressure-receiving function while the inner container 10 is wholly or partially pressure-free. In the pressure-free state, the inner container resists to the occuring high temperatures. By switch-on of the heating means 21, additional heat can act on the inner container from the outside. The vacuum in the intermediate space 19 provides for heat insulation of the inner container against the outer container.

The suction means can be omitted if the inner container 10 is provided with an opening 29, adapted to be closed. Opening 29 is opened up in case of high-temperature operation. Vacuum generation in intermediate space 19 is then carried out by vacuum pump 15.

Using a separate suction means 27 for intermediate space 19 yields the advantage that the pressure in intermediate space 19 can be set and controlled independently of the pressure in container 10. There fore, pressure can also be distributed among both of the containers 10 and 18 for high-temperature operation.

Instead of the thermal insulation means 20 or in addition thereto, there can be provided the radiation insulating means 30 shown in FIGS. 3a and 3b. Radiation insulating means 30 consists of a plurality of lamellae 31 which can be moved individually and can be selectively brought into the opening position shown in FIG. 3a or into the closing position shown in FIG. 3b wherein the lamellae form a closed ring. The lamellae 31 are radiation-reflective, and their function consists in reflecting the heat radiating from inner container 10. By thermostatic control, the lamellae can be set also to intermediate positions in such a manner that a desired temperature is maintained in the treatment chamber. In place of the radiation shield shown in FIG. 3 wherein the lamellae can be pivoted individually, it is also possible to use a radiation shield wherein the lamellae can be moved in linear direction while over lapping each other.

By controlling the energy transmission from inner container 10 to outer container 18 (either by convective flow or heat radiation); the temperature in the treatment chamber can be kept at a desired value. Temperature control is also possible by varying the pressure in intermediate space 19.

In the low-temperature mode, the treatment apparatus is operated as a hot-wall oven, whereas in case of high temperatures, the treatment apparatus is operated as a cold-wall oven.

I claim:

1. A plasma treatment apparatus comprising:

a substantially vacuum-tight first container having an interior and configured for connection to a vacuum pump and configured for receiving a workpiece, a substantially vacuum-tight second container surrounding the first container, whereby an intermediate space is formed between the first and second containers, an electrode configured to be fastened to the workpiece, a counterelectrode, a gas source for introducing treatment gas into the first container, and means for evacuating the intermediate space between the first and second containers to thereby provide a thermal vacuum isolation between the first and second containers, and means for changing the thermal vacuum isolation to thereby maintain the interior of the first container at a desired temperature.

2. The plasma treatment apparatus according to claim 1 comprising thermal insulation means arranged in the intermediate space for providing thermal insulation.

3. The plasma treatment apparatus according to claim 1 comprising circulating means arranged in the intermediate space for providing convention insulation.

4. The plasma treatment apparatus according to claim 1 comprising radiation insulating means arranged in the intermediate space for providing radiation insulation.

5. The plasma treatment apparatus according to claim 4 wherein the radiation insulating means comprises a plurality of lamellae adjustable relative to each other.

6. The plasma treatment apparatus according to claim 2 wherein the first container defines a temperature and wherein the thermal insulation means is controlled in dependence on the temperature in the first container.

7. The plasma treatment apparatus according to claim 1 comprising a suction device in communication with the intermediate space.

8. The plasma treatment apparatus according to claim 1 comprising a heater arranged in the intermediate space.

* * * * *